(12) United States Patent
Ueda et al.

(10) Patent No.: US 9,472,404 B2
(45) Date of Patent: Oct. 18, 2016

(54) DOPING METHOD, DOPING APPARATUS AND METHOD OF MANUFACTURING SEMICONDUCTOR DEVICE

(71) Applicant: TOKYO ELECTRON LIMITED, Tokyo (JP)

(72) Inventors: Hirokazu Ueda, Yamanashi (JP); Masahiro Oka, Yamanashi (JP); Yasuhiro Sugimoto, Yamanashi (JP); Masahiro Horigome, Hokuto (JP); Yuuki Kobayashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/582,417

(22) Filed: Dec. 24, 2014

(65) Prior Publication Data

US 2015/0187582 A1    Jul. 2, 2015

(30) Foreign Application Priority Data

Dec. 27, 2013  (JP) ................................. 2013-273266

(51) Int. Cl.
*H01L 21/26* (2006.01)
*H01L 21/223* (2006.01)
*H01J 37/32* (2006.01)

(52) U.S. Cl.
CPC ..... *H01L 21/2236* (2013.01); *H01J 37/32192* (2013.01); *H01J 37/32412* (2013.01)

(58) Field of Classification Search
None
See application file for complete search history.

(56) References Cited

U.S. PATENT DOCUMENTS

| 5,012,320 | A  | * | 4/1991 | Yamazaki | H01L 21/28052 257/755 |
|---|---|---|---|---|---|
| 2010/0167507 | A1 | * | 7/2010 | Horigome | H01L 21/2236 438/513 |
| 2012/0015507 | A1 | * | 1/2012 | Tanaka | H01J 37/32412 438/513 |
| 2013/0078788 | A1 | * | 3/2013 | Suguro | H01L 21/26513 438/513 |

OTHER PUBLICATIONS

K. Han, et al., "A Novel Plasma-based Technique for Conformal 3D FINFET Doping," Junction Technology (IWJT), 2012 12th International Workshop on, Date May 14-15, 2012, IEEE (3 pages).
Y. Sasaki, et al., "Improved Sidewall Doping of Extensions by AsH3 Ion Assisted Deposition and Doping (IADD) with Small Implant Angle for Scaled NMOS Si Bulk FinFETs," proceeding IEDM 2013, IEEE (4 pages).

* cited by examiner

*Primary Examiner* — Reema Patel
(74) *Attorney, Agent, or Firm* — Rothwell, Figg, Ernst & Manbeck, P.C.

(57) ABSTRACT

Disclosed is a plasma doping apparatus and a plasma doping method for performing a doping on a processing target substrate by implanting dopant ions into the processing target substrate. The plasma doping method includes a plasma doping processing performed on the processing target substrate held on a holding unit within a processing container by generating plasma using a microwave. The plasma doping method also includes an annealing processing which is performed on the processing target substrate which has been subjected to the plasma doping processing.

14 Claims, 13 Drawing Sheets

(1)　　　(2)

DOPING METHOD, DOPING APPARATUS AND METHOD OF MANUFACTURING SEMICONDUCTOR DEVICE

CROSS-REFERENCE TO RELATED APPLICATIONS

This application is based on and claims priority from Japanese Patent Application No. 2013-273266, filed on Dec. 27, 2013, with the Japan Patent Office, the disclosure of which is incorporated herein in its entirety by reference.

TECHNICAL FIELD

The present disclosure relates to a doping method, a doping apparatus and a method of manufacturing a semiconductor device.

BACKGROUND

A semiconductor device such as a large scale integrated circuit (LSI) or a metal oxide semiconductor (MOS) transistor is manufactured by performing a processing such as doping, etching, chemical vapor deposition (CVD) or sputtering on a semiconductor substrate (a wafer) which becomes a processing target substrate.

Here, as a method of performing a doping, there are an ion doping method using an ion implanting device, and a plasma doping method of directly implanting radicals or ions of dopant into the surface of a processing target object using plasma. A request for a method of uniformly implanting dopant impurities into a doping target having a three-dimensional structure, such as a Fin-type field effect transistor (FinFET-type) semiconductor device, irrespective of uneven portions of the three-dimensional structure (a conformal doping method), has recently been highly increased. As a result, numerous attempts on a doping method using plasma have been reported.

For example, a doping method (a plasma doping method) using a doping processing device employs a technology in which ionic plasma is mainly produced and then the produced ionic plasma is distracted to perform doping on the entire three-dimensional structure.

As a recently attempted method of uniformly implanting dopant ions into a side wall of a FinFET-type semiconductor device, a method called ion assisted deposition and doping (IADD) in which dopant ions are conformally implanted into the side wall of the FinFET-type semiconductor device has been introduced. The IADD is a method of additionally performing ion slant irradiation on an As (arsenic) film formed using plasma.

Here, when doping is performed on a doping target having a three-dimensional structure, such as a FinFET-type semiconductor device, there is a background in that respective portions of the doping target are required to have a high coatability, that is, a high conformality (uniformity) in doping such that doping depths from the surfaces of the respective portions or dopant concentrations are uniform. In relation to this, see, for example, non-patent literatures 1: K. Han*, S. Tang, T. Rockwell, L. Godet, H. Persing, C. Campbell, S. Salimian, Junction Technology (IWJT), 2012 12th International Workshop on, Date 14-15 May 2012, IEEE, and 2: Y. Sasaki, L. Godetl, T. Chiarella, D. P. Brunco2, T. Rockwelll, J. W. Lee, B. Colombeaul, M. Togo, S. A. Chew, G. Zschaetszch, K. B. Noh3, A. De Keersgieter, G. Boccardi, M. S. Kim, G. Hellings, P. Martinl, W. Vandervorst, A. Thean, and N. Horiguchi, "Improved Sidewall Doping of Extensions by $AsH_3$ Ion Assisted Deposition and Doping (IADD) with Small Implant Angle for Scaled NMOS SiBulk FinFETs", proceeding IEDM 2013, IEEE.

SUMMARY

The present disclosure provides a method of performing a doping on a processing target substrate by implanting dopant ions into the processing target substrate. The method includes: generating plasma within a processing container using a microwave thereby performing a plasma doping processing on the processing target substrate held on a holding unit within the processing container; and annealing the processing target substrate which has been subjected to the plasma doping processing.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
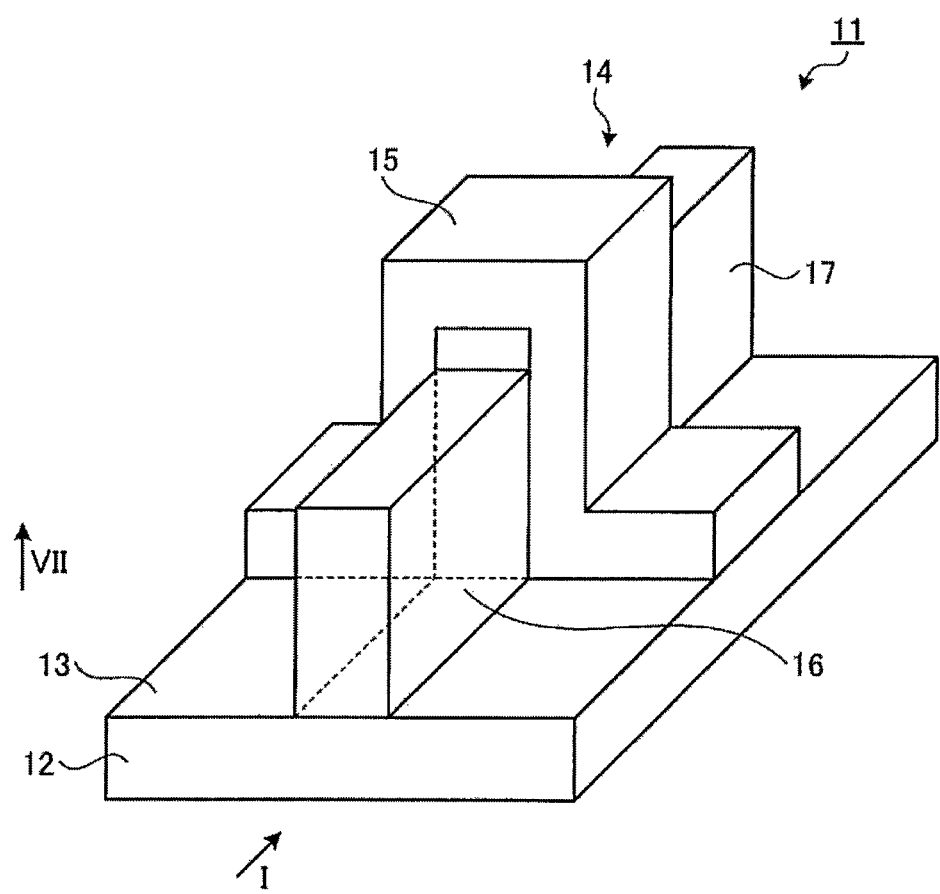
FIG. 1 is a schematic perspective view illustrating a part of a FinFET-type semiconductor device as a semiconductor device manufactured by a doping method and a doping apparatus according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a conventional technology, there is a problem in that doping cannot be conformally performed on a doping target having a three-dimensional structure, such as a FinFET-type semiconductor device.

For example, when the conventional ion doping is performed using the conventional IADD technique, in a FinFET-type semiconductor device having a three-dimensional structure, an ion irradiation amount at a portion hidden by the three-dimensional structure serving as a three-dimensional barrier is smaller than a top portion of the Fin. Thus, conformal (uniform) doping may not be completely performed. In a more detailed example, when doping is performed using ion beam, ion beam is irradiated at an angle of 45° on a substrate surface of the FinFET-type semiconductor device in order to perform doping on all of a top portion, a side surface, and a bottom portion of a Fin of a FinFET-type semiconductor device. Then, the ion beam is irradiated at an angle of 135°, that is, an angle of 45° from the opposite side. As a result, when the Fin has a height to some extent, irradiated ions do not reach a region of the side portion close to the bottom portion in the height direction of the Fin, and the bottom portion.

In order to overcome the disadvantages of the ion doping, in the conventional IADD, there has been reported a method of forming an As-containing thin film, which is deposited using plasma at a low temperature, on a Fin surface in advance, and irradiating ion components through application of a bias electric field to knock As atoms in Si (Fin Body). However, an object for performing conformal doping on both the top portion and the side wall of the Fin Body is not completely achieved by the method.

In the technology for performing a doping on the whole of the three-dimensional structure by distracting the produced ionic plasma, ion species of dopants (ions) generated by the plasma are randomly irradiated on the surface of the three-dimensional structure by an ion extracting mechanism constituted by an extraction plate. However, all experimental data indicated by this method suggest that the thickness of an amorphous layer (disordered layer of Si crystals including dopants) formed on the surface of the three-dimensional structure is conformal, but does not suggest that conformal doping may be performed on both the top portion and the side wall of the Fin Body at a uniform concentration of dopants.

That is, in the doping method using the doping processing device as described above, only the layer thickness of a pre-amorphous layer generated through the doping is uniform, but the doping processing is not conformally performed. For example, in the conventional technology as described above, in a FinFET-type semiconductor device having a three-dimensional structure, concentrations of dopants implanted at the top portion, the side portion and the bottom portion, and doping depths at the these portions are not uniform, and thus the doping is not conformally performed.

According to an aspect of the present disclosure, there is provided a method of performing a doping on a processing target substrate by implanting dopant ions into the processing target substrate. The method includes: generating plasma within a processing container using a microwave thereby performing a plasma doping processing on the processing target substrate held on a holding unit within the processing container; and annealing the processing target substrate which has been subjected to the plasma doping processing.

According to an aspect of the disclosed doping method, an annealing processing process may be performed subsequently to a plasma doping processing on a doping target having a three-dimensional structure such as a FinFET-type semiconductor device. Thus, there is an effect in that distribution of impurities on the surface of the processing target substrate may be conformally reformed.

Hereinafter, exemplary embodiments of the disclosed doping method will be described in detail with reference to drawings. The present disclosure is not limited the present exemplary embodiments. The exemplary embodiments may be combined properly within a range which does not cause a contradiction in processing contents.

First Exemplary Embodiment

A doping method according to the first exemplary embodiment is a plasma doping method of performing a doping on a processing target substrate by implanting dopant ions into the processing target substrate. The method includes: generating plasma within a processing container using a microwave thereby performing a plasma doping processing on the processing target substrate held on a holding unit within the processing container; and annealing the processing target substrate which has been subjected to the plasma doping processing.

In the doping method according to the first exemplary embodiment, the plasma doping processing uses, as a microwave input power for generating the microwave, a power which allows a power density per stage unit area to be 5.6 W/cm$^2$ or more.

In the doping method according to the first exemplary embodiment, the plasma doping processing uses, as a microwave power for generating the microwave, a microwave power having a value which allows a power density per wafer unit density to be 4.2 W/cm$^2$ or more.

In the doping method according to the first exemplary embodiment, the annealing is performed at a temperature ranging from 600° C. to 950° C. when arsenic (As) is used as the dopant ions.

In the doping method according to the first exemplary embodiment, the plasma doping processing is performed using the plasma generated by a radial line slot antenna.

A doping apparatus according to the first exemplary embodiment includes: a processing container; a gas supply unit configured to supply a doping gas and an inert gas for plasma excitation into the processing container; a holding unit disposed within the processing container and configured to hold a processing target substrate thereon; a plasma generating mechanism configured to generate plasma within the processing container by using a microwave; a heating mechanism configured to heat the processing target substrate by applying the microwaves (a microwave heating method without plasma application); and a control unit. The control unit controls the plasma generating mechanism to generate the plasma within the processing container to perform a plasma doping processing on the processing target substrate held on the holding unit disposed within the processing container, and controls a stage temperature according to the heating mechanism configured to heat the processing target substrate by applying the microwaves (the microwave heating method without plasma application) to perform an annealing processing on the processing target substrate which has been subjected to the plasma doping processing. In the microwave heating method without plasma application, a microwave annealing technology is used.

In the doping apparatus according to the first exemplary embodiment, the control unit uses, as a microwave power for generating the microwave, a microwave power having a value which allows a power density per wafer unit density to be 4.2 $W/cm^2$ or more.

In the doping apparatus according to the first exemplary embodiment, the control unit performs the annealing processing at a temperature ranging from 600° C. to 950° C.

In the doping apparatus according to the first exemplary embodiment, the plasma generating mechanism includes a radial line slot antenna, and the control unit performs the plasma doping processing using the plasma generated by the radial line slot antenna.

In the doping apparatus according to the first exemplary embodiment, the plasma generating mechanism includes a dielectric window which is exposed within the processing container and provided at a location facing the holding unit, and a shortest distance between the dielectric window and the processing target substrate held on the holding unit ranges from 5.5 cm to 15 cm.

According to the first exemplary embodiment, there is provided a method of manufacturing a semiconductor device by a plasma doping method. The plasma doping method is designed for performing a doping on a processing target substrate by implanting dopant ions into the processing target substrate. The plasma doping method includes: generating plasma within a processing container using a microwave thereby performing a plasma doping processing on the processing target substrate held on a holding unit within the processing container; and annealing the processing target substrate which has been subjected to the plasma doping processing.

Doping Apparatus According to First Exemplary Embodiment

FIG. 1 is a schematic perspective view illustrating a part of a FinFET-type semiconductor device as a semiconductor device manufactured by a doping method and a doping apparatus according to a first exemplary embodiment. Referring to FIG. 1, a FinFET-type semiconductor device 11 manufactured by the doping method and the doping apparatus according to the exemplary embodiment of the present disclosure is formed with a Fin 14 which protrudes upwardly by a predetermined length from a main surface 13 of a silicon substrate 12. The extension direction of the Fin 14 is indicated by arrow I in FIG. 1. The portion of the Fin 14 is substantially rectangular when viewed in the direction of arrow I which is the horizontal direction of the FinFET-type semiconductor device 11. A gate 15 that extends in a direction perpendicular to the extension direction of the Fin 14 is formed to cover a portion of the Fin 14. A source 16 is formed at the front side of the formed gate 15 in the Fin 14, and a drain 17 is formed at the back side of the gate 15. Doping is performed by plasma generated by using microwaves on such a shape of the Fin 14, that is, the surface of a portion protruding upwardly from the main surface 13 of the silicon substrate 12.

Although not illustrated in FIG. 1, in some semiconductor device manufacturing processes, photoresist layers may be formed in a step before the doping is performed. The photoresist layers are formed at a predetermined interval at the lateral sides of the Fin 14, for example, at portions located at the left and right sides in the paper sheet in FIG. 1. The photoresist layers extend in the same direction as the Fin 14 and are formed to protrude upwardly by a predetermined length from the main surface 13 of the silicon substrate 12.

Figure 2:
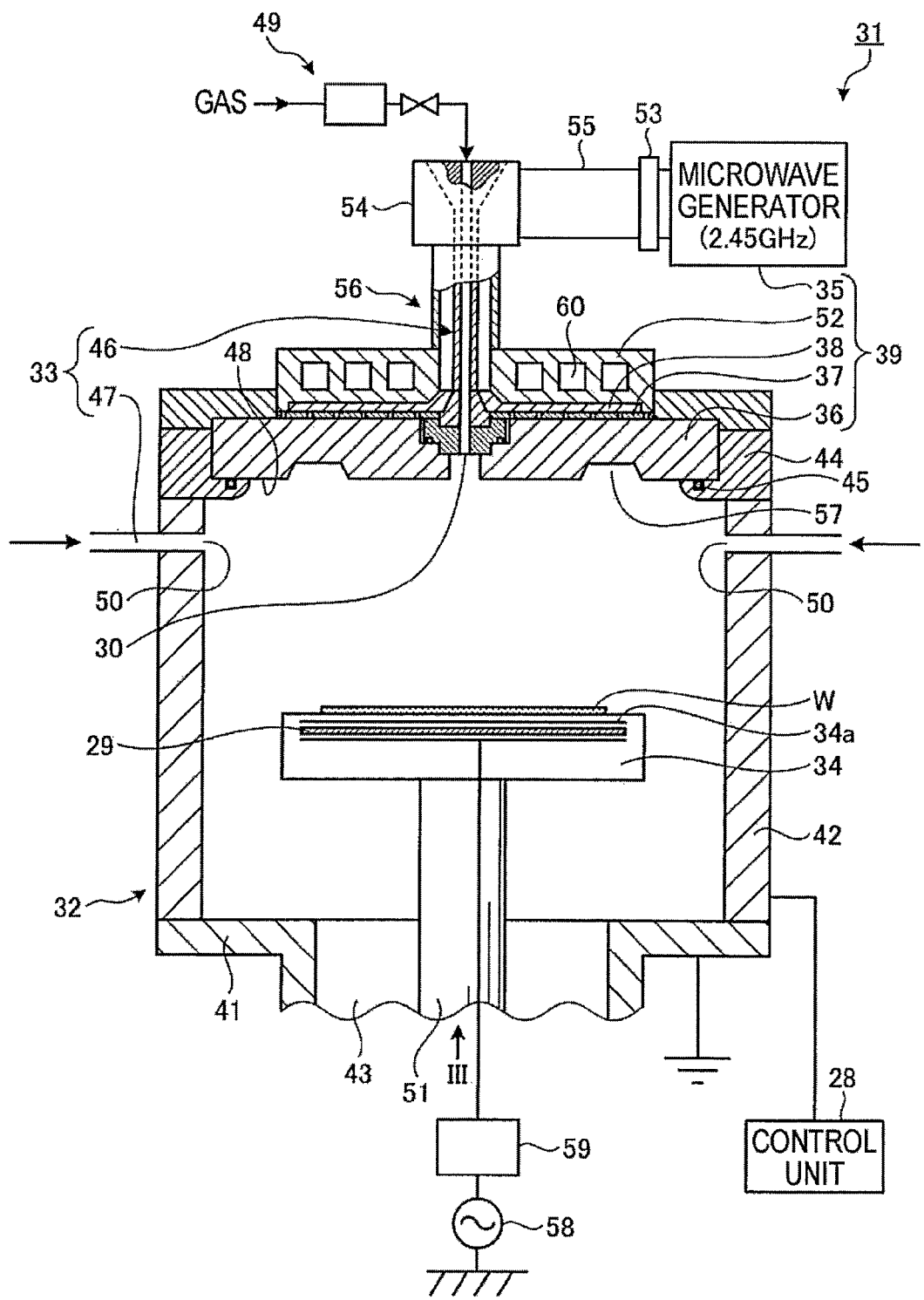
FIG. 2 is a schematic cross-sectional view illustrating a main part of the doping apparatus according to the first exemplary embodiment.
Figure 3:
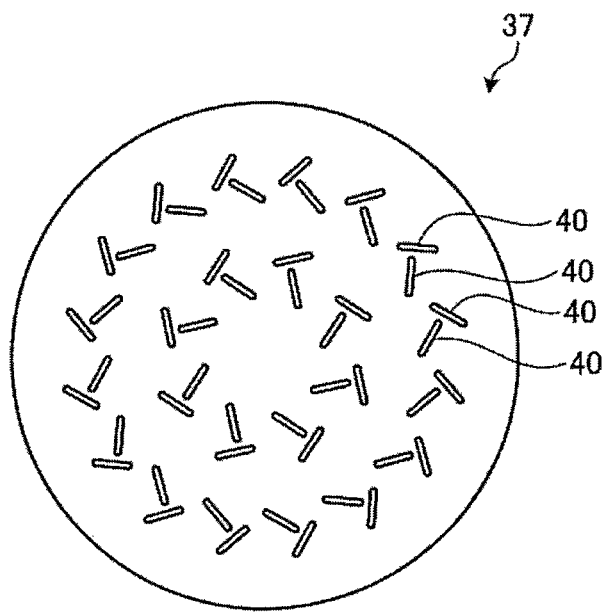
FIG. 3 is a schematic view illustrating a slot antenna plate included in the doping apparatus illustrated in FIG. 2 when viewed from the arrow III in FIG. 2.

FIG. 2 is a schematic cross-sectional view illustrating a main part of the doping apparatus according the first exemplary embodiment. FIG. 3 is a view illustrating a slot antenna plate included in the doping apparatus illustrated in FIG. 2 when viewed from the bottom side, that is, in the direction of arrow III in FIG. 2. In FIG. 2, hatching of some members is omitted for an easy understanding. In this exemplary embodiment, the vertical direction in the paper sheet in FIG. 2 is considered as the vertical direction of the doping apparatus.

Referring to FIGS. 2 and 3, a doping apparatus 31 includes a processing container 32 configured to perform doping on a processing target substrate W therein, a gas supply unit 33 configured to supply a gas for plasma excitation or a doping gas into the processing container 32, a disk-shaped holding unit 34 configured to hold the processing target substrate W thereon, a plasma generating mechanism 39 configured to generate plasma within the processing container 32 by using microwaves, a pressure control mechanism configured to control the pressure within the processing container 32, a bias power supply mechanism configured to supply an AC bias power to the holding unit 34, and a control unit 28 configured to control the entire operation of the doping apparatus 31. The control unit 28 performs the entire control of the doping apparatus 31 such as, for example, the control of a gas flow rate in the gas supply unit 33, a pressure within the processing container 32, and a bias power to be supplied to the holding unit 34.

The processing container 32 includes a bottom portion 41 located below the holding unit 34, and a side wall 42 extending upwardly from the outer periphery of the bottom portion 41. The side wall 42 has a substantially cylindrical shape. An exhaust hole 43 for exhausting a gas is provided at the bottom portion 41 of the processing container 32 to extend through a portion of the bottom portion 41. The top side of the processing container 32 is opened, and the processing container 32 is configured to be capable of being sealed by a cover unit 44 disposed on the top of the processing container 32, a dielectric window 36 to be described later, and an O ring 45 as a sealing member interposed between the dielectric window 36 and the cover unit 44.

The gas supply unit 33 includes a first gas supply unit 46 configured to eject a gas toward the center of the processing target substrate W, and a second gas supply unit 47 configured to eject a gas from the outside of the processing target substrate W. A gas supply hole 30 configured to supply the gas from the first gas supply unit 46 is provided at the center of the dielectric window 36 in a diametrical direction, that is, a position retracted inwardly into the dielectric window 36 from a bottom surface 48 of the dielectric window 36. The bottom surface 48 faces the holding unit 34. The first gas supply unit 46 supplies an inert gas for plasma excitation or a doping gas while controlling, for example, a flow rate, through a gas supply system 49 connected to the first gas supply unit 46. The second gas supply unit 47 is formed by forming a plurality of gas supply holes 50 at the upper portion of the side wall 42. The plurality of gas supply holes 50 is configured to supply an inert gas for plasma excitation or a doping gas into the processing container 32. The plurality of gas supply holes 50 is formed at equal intervals in the circumferential direction. The first gas supply unit 46 and the second gas supply unit 47 are supplied with the same kind of inert gas for plasma excitation or the same kind of doping gas from a common gas supply source. Also, according to a demand or a control specification, different gases may be supplied from the first gas supply unit 46 and the second gas supply unit 47, and, for example, the flow rate ratio thereof may be adjusted.

In the holding unit 34, a high frequency power source 58 for a radio frequency (RF) bias is electrically connected to an electrode within the holding unit 34 via a matching unit 59. The high frequency power source 58 is capable of outputting a high frequency of, for example, 13.56 MHz with a predetermined power (bias power). The matching unit 59 accommodates a matching device configured to match the impedance at the high frequency power source 58 side, with the impedance at the load side mainly such as, for example, the electrode, the plasma, and the processing container 32, and a blocking capacitor is included in the matching device to generate self bias. At the time of doping, the supply of a bias voltage to the holding unit 34 is appropriately varied as desired. The control unit 28, as the bias power supply mechanism, controls the AC bias power to be supplied to the holding unit 34.

The holding unit 34 may hold the processing target substrate W thereon by an electrostatic chuck (not illustrated). The holding unit 34 may be provided with, for example, a heater 34a for temperature control, and the temperature of the holding unit 34 may be set to a temperature as desired by a temperature control mechanism 29 provided inside the holding unit 34. The holding unit 34 is supported by an insulative cylindrical support 51 that extends vertically upwardly from the lower side of the bottom portion 41. The exhaust hole 43 is formed to extend through a portion of the bottom portion 41 of the processing container 32 along the outer periphery of the cylindrical support 51. An exhaust device (not illustrated) is connected at the lower side of the annular exhaust hole 43 via an exhaust tube (not illustrated). The exhaust device includes a vacuum pump such as, for example, a turbo molecular pump. The inside of the processing container 32 may be decompressed to a predetermined pressure by the exhaust device. The control unit 28, as a pressure control mechanism, controls the pressure within the processing container 32 through, for example, the control of exhaustion by the exhaust device.

The plasma generating mechanism 39 includes a microwave generator 35 which is provided outside the processing container 32 and configured to generate microwaves for plasma excitation. The plasma generating mechanism 39 includes the dielectric window 36 which is disposed at a position facing the holding unit 34, and introduces the microwaves generated by the microwave generator 35 into the processing container 32. The plasma generating mechanism 39 includes a slot antenna plate 37 which is formed with a plurality of slots 40 and disposed on the top side of the dielectric window 36. The slot antenna plate 37 is configured to radiate the microwaves to the dielectric window 36. The plasma generating mechanism 39 may include a dielectric member 38 which is disposed on the top of the slot antenna plate 37 and configured to radially propagate the microwaves introduced from a coaxial waveguide 56 to be described later.

The microwave generator 35 having a matching unit 53 is connected to the top of the coaxial waveguide 56 configured to introduce the microwaves, via a mode converter 54 and a waveguide 55. For example, TE-mode microwaves generated by the microwave generator 35 pass through the waveguide 55, are converted into TEM-mode microwaves by the mode converter 54, and propagate through the coaxial waveguide 56. As the frequency of the microwaves generated by the microwave generator 35, for example, 2.45 GHz is selected.

The dielectric window 36 has a substantially disk shape and is formed of a dielectric material. An annular recess 57 which is recessed in a tapered shape is provided at a portion of the bottom surface 48 of the dielectric window 36, so as to ensure that standing waves may be easily generated by the introduced microwaves. Plasma by microwaves may be efficiently generated at the bottom side of the dielectric window 36 by the recess 57. A specific material for the dielectric window 36 may be, for example, quartz or alumina.

The slot antenna plate 37 is formed in a thin disk shape. The plurality of slots 40, as illustrated in FIG. 3, is formed so that two slots 40 are paired to be perpendicular to each other and spaced apart from each other at a predetermined interval. The paired slots 40 are formed in the circumferential direction at a predetermined interval. The plurality of pairs of slots 40 are formed at a predetermined interval in the radial direction. Here, the slot antenna plate 37 may be a radial line slot antenna.

The microwaves generated by the microwave generator 35 are propagated through the coaxial waveguide 56. The microwaves radially spread from a region interposed between the slot antenna plate 37 and a cooling jacket 52 to the outside in the radial direction and then are radiated from the plurality of slots 40 formed in the slot antenna plate 37 to the dielectric window 36. The cooling jacket 52 has a circulation path 60 configured to circulate a coolant therein to control the temperature of, for example, the dielectric member 38. The microwaves which have transmitted through the dielectric window 36 generate an electric field just below the dielectric window 36 and generate the plasma within the processing container 32.

As described above, the plasma generating mechanism includes the dielectric window 36 which is exposed within the processing container 32 and provided at a location facing the holding unit 34. Here, a shortest distance between the dielectric window 36 and the processing target substrate W held on the holding unit 34 ranges from 5.5 cm to 15 cm.

When the microwave plasma is generated in the doping apparatus 31, a so-called plasma generating region with a relatively high electron temperature of the plasma is formed just below the bottom surface 48 of the dielectric window 36, specifically, at a region positioned about several centimeters below the bottom surface 48 of the dielectric window 36. Then, at a region positioned vertically below the plasma generating region, a so-called plasma diffusion region is formed in which the plasma generated in the plasma generating region is diffused. The plasma diffusion region has a relatively low electron temperature of the plasma, in which a plasma doping processing, that is, a doping is performed. Also, when the microwave plasma is generated in the doping apparatus 31, the electron density of the plasma becomes relatively high. Then, at the time of doping, a so-called plasma damage to the processing target substrate W is not caused. Also, since the electron density of the plasma is high, an efficient doping, specifically, for example, shortening of a time for doping may be achieved.

Here, in inductively coupled plasma (ICP) of a general plasma source, a production amount of high energy ions in the plasma becomes much larger than that of radicals and low energy ion components. Thus, a plasma irradiation damage to the processing target substrate is also increased. In contrast, when microwave plasma is used, in a high pressure zone (100 mTorr or more) advantageous for conformal doping formation, radicals and low energy ion components may be efficiently generated. Also, when the microwave plasma is used, the radicals (active species) are not affected by the plasma electric field. That is, the radicals are electrically neutral, and thus may overwhelmingly reduce a plasma irradiation damage to the processing target substrate as compared to ions.

Figure 4:
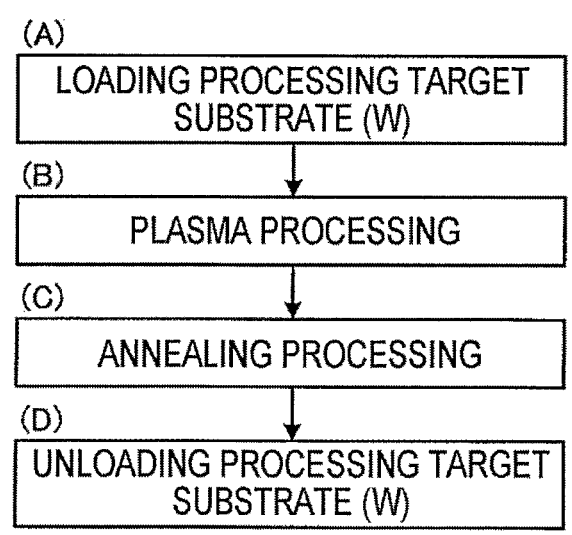
FIG. 4 is a flow chart illustrating a schematic process of the doping method according to the first exemplary embodiment.

Hereinafter, descriptions will be made on a method of performing a doping on the processing target substrate W using the doping apparatus. FIG. 4 is a flow chart illustrating a schematic process of the doping method according to the first exemplary embodiment.

Referring to FIG. 4, first, the processing target substrate W is carried into the processing container 32 ((A) of FIG. 4), and is held on the holding unit 34. Then, a doping gas is supplied into the processing container 32, thereby performing a plasma doping processing ((B) of FIG. 4). That is, a plasma doping processing process is performed in which plasma is generated within the processing container 32 by using microwaves to perform the plasma doping processing on the processing target substrate W held on the holding unit 34 within the processing container 32. More specifically, the control unit 28 generates radicals and low energy ion components through a radial line slot antenna, thereby performing a doping on the processing target substrate W.

Here, for example, the control unit 28 uses an arsine ($AsH_3$) gas diluted with He gas to 1% or less, as a processing gas. The control unit 28 may use arsine ($AsH_3$) gas diluted with He gas to 1% or less and a He dilution gas, and may use the arsine ($AsH_3$) gas added with a very small amount of hydrogen (H), as the processing gas. The control unit 28 uses $AsH_3$ (0.7%)/He dilution gas as the processing gas at a flow rate ranging from 50 sccm to 1500 sccm. The control unit 28 may use the processing gas at a flow rate of 200 sccm or more, or may use 400 sccm. The control unit 28 uses a pressure ranging from 100 mTorr to 1 Torr. Also, the control unit 28 may use a pressure ranging from 100 mTorr to 1 Torr, and may use a pressure ranging from 100 mTorr to 300 mTorr.

The control unit 28 uses, as the power of the microwaves, that is, the power for generating microwaves, a value which allows a power density per wafer unit density to be 4.2 $W/cm^2$ or more. That is, for example, when a 300 mm stage is used, a value of 3 kw or more is used as the power of the microwaves. The control unit 28 may use, as the microwave power, a value which allows a power density per wafer unit density to be 5.6 $W/cm^2$ or more. That is, for example, when a 300 mm stage is used, a value not less than 4 kw is used as the power of the microwaves. In this manner, when the control unit 28 uses the value which allows the power density to be 5.6 $W/cm^2$ or more, plasma doping may be securely performed. The control unit 28 may use, as the microwave power, a value which allows a power density per wafer unit density to be 7.1 $W/cm^2$ or more. That is, for example, when a 300 mm stage is used, a value not less than 5 kw is used as the power of the microwaves. In this manner, when the control unit 28 uses the value which allows the power density to be 7.1 $W/cm^2$ or more, plasma doping may be securely and satisfactorily performed.

In a specific example of a recipe used by the control unit 28, the control unit 28 sets the microwave power to 5 kW, and the pressure within the processing container 32 to 230 mTorr. An input power ranging from 0 W to 300 W is used in the power source 58 in order to apply the RF bias (13.56 MHz) to the wafer stage. Here, since the RF bias (13.56 MHz) is applied for the purpose of further stabilizing plasma, the application of RF bias to the stage is not necessary. The control unit 28 sets a total flow rate of the processing gas as 1000 sccm, allows $AsH_3$ (0.7%)/He dilution gas to flow at a flow rate ranging from 200 sccm to 500 sccm, and uses He gas as a remaining gas. The control unit 28 adds $H_2$ gas at a flow rate ranging from 0 sccm to 5 sccm. The $H_2$ gas is added for the purpose of improving the uniformity of plasma generation, and thus the addition of the $H_2$ gas is not necessary in the sense of establishing a plasma doping condition of the present object. The plasma doping processing is performed for 100 sec. However, the recipe used by the control unit 28 is not limited thereto.

It is known that in a case where the plasma is generated by using the microwaves, as compared to in the plasma generated by other plasma sources (e.g., plasma sources such as ICP or capacitively coupled plasma (CCP)), a plasma processing may be performed on a processing target sample (wafer) under specific circumstances of a high electron density and a low electron temperature. In the plasma in such a state, more active species (radicals) and more low energy ions may be generated, and thus a plasma doping processing may be performed mainly by radicals and low energy ion components.

When the input power of the microwaves is intentionally lowered, and the RF bias is strongly applied to the holding unit of the processing target sample (wafer) to intentionally give a drawing-in electric field to the processing target substrate, atoms in the ionic plasma may be strongly irradiated to the processing target sample (wafer), so that the plasma doping processing is performed mainly by ions. For example, an RF bias of 13.56 MHz is applied with 500 W or more/(300 mm wafer stage)=7 $mW/cm^2$ or more, the plasma doping processing is performed mainly by ions. Based on this, the RF bias may not be strongly applied so that the drawing-in electric field is not intentionally given to the processing target substrate. For example, the RF bias of 13.56 MHz may not be applied with 500 W or more/(300 mm wafer stage)=7 $mW/cm^2$ or more.

Then, an annealing processing is performed ((C) of FIG. 4). That is, an annealing processing process is performed in which an annealing processing is performed on the processing target substrate W which has been subjected to the plasma doping processing. For example, the control unit 28 controls the temperature control mechanism 29 or the heater 34a in the holding unit 34 to heat the processing target substrate W.

Here, the control unit 28 performs the annealing processing at a temperature ranging from 600° C. to 950° C. The control unit 28 may perform the annealing at a temperature ranging from 613° C. to 850° C., or from 650° C. to 850° C. The control unit 28 performs the annealing for a time ranging from, for example, 30 sec to 90 sec. More specifically, when the temperature for annealing is 800° C. or less, the control unit 28 performs the annealing for a time ranging from 30 sec to 90 sec. When the temperature for annealing is higher than 800° C., the control unit 28 may perform the annealing for a time of 60 sec or less, or 30 sec or less.

Here, the annealing processing on the processing target substrate which has been subjected to the plasma doping processing process may be performed within an apparatus for performing the plasma doping processing, continuously after the plasma doping processing is finished. However, the present disclosure is not limited thereto. For example, the substrate may be carried once out of the apparatus for performing the plasma doping processing and then subjected to the annealing processing by a separate apparatus. The annealing processing may be performed by using, for example, microwave annealing or rapid thermal annealing (RTA) of Kochi.

Here, the annealing processing will be further described. The annealing processing is different from an annealing processing for activation of doped impurities in a conventional semiconductor manufacturing technology. When the processing for the activation of doped impurities is performed, apart from the annealing processing as described above, a heat treatment at an ultra-high temperature for an ultra-short-time, such as spike annealing or flash annealing, is performed.

After the annealing processing is finished, the processing target substrate W is removed from the holding unit 34 and carried out of the processing container 32 ((D) of FIG. 4).

Effect of First Exemplary Embodiment

In this manner, doping is performed on the processing target substrate W. That is, the doping apparatus 31 according to the exemplary embodiment of the present disclosure includes the processing container 32, the gas supply unit 33 configured to supply a doping gas or an inert gas for plasma excitation into the processing container 32, the holding unit 34 disposed within the processing container 32 and configured to hold the processing target substrate thereon, the plasma generating mechanism 39 configured to generate plasma within the processing container 32 by using microwaves, the heater 34a configured to heat the processing target substrate W, and the control unit 28. Here, the control unit 28 generates the plasma within the processing container 32 using the microwaves so as to perform the plasma doping processing on the processing target substrate W held on the holding unit 34 within the processing container 32 and to perform the annealing processing on the processing target substrate W which has been subjected to the plasma doping processing. As a result, conformal doping may be performed on a doping target such as a FinFET-type semiconductor device.

That is, even when a conventionally used plasma doping using ions, or an impurity injection technology using an ion implanting technology employs the annealing processing as described above, that is, the conformal annealing processing, conformal doping may not be performed on the processing target substrate. In contrast, as described above, in the first exemplary embodiment, a plasma doping processing is performed by generating plasma within the processing container 32 using the microwaves, and then the annealing processing as described above is performed so that the conformal doping may be performed.

Figure 5:
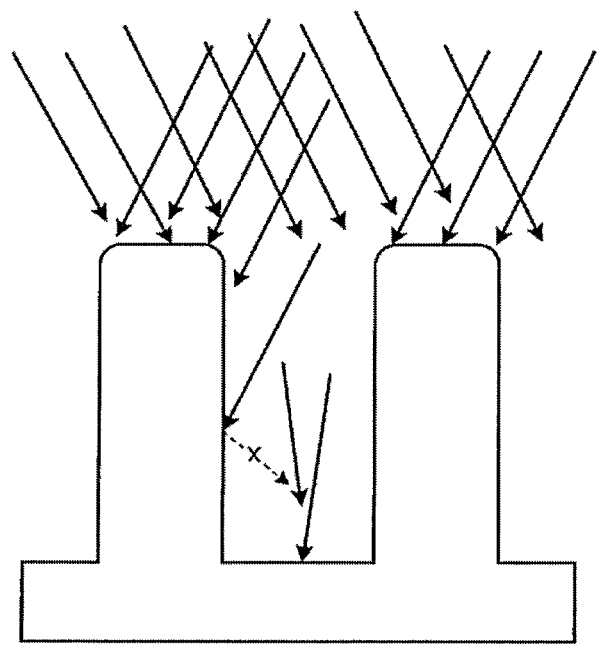
FIG. 5 is a view illustrating a doping amount on a FinFET-type semiconductor device in a case where doping is performed using a plasma doping processing.

The effect of the first exemplary embodiment will be further described. FIG. 5 is a view illustrating a doping amount on a FinFET-type semiconductor device in a case where doping is performed using a plasma doping processing. In the example illustrated in FIG. 5, the processing target substrate W is a FinFET-type semiconductor device. Here, when, for example, reflection is not taken into consideration, as illustrated in FIG. 5, the amounts of radicals and low energy ion components reaching respective portions are different due to the three-dimensional shape of a Fin provided on the processing target substrate W. For example, when radicals and low energy ion components generated by a radial slot antenna come in contact with a top portion Wa of the FinFET in the processing target substrate W, dopants are implanted into the top portion Wa. Among radicals and low energy ion components which do not come in contact with the top portion Wa of the FinFET, radicals and low energy ion components coming in contact with a side surface Wb implant dopants into the side surface Wb. Among radicals and low energy ion components which do not come in contact with both the top portion Wa and the side surface Wb of the FinFET, radicals and low energy ion components coming in contact with a bottom portion Wc implant dopants into the bottom portion Wc. That is, since a three-dimensional barrier is generated in the FinFET, the probability of coming in contact with radicals and low energy ion components is decreased in the order of the top portion Wa, the side surface Wb, and the bottom portion Wc in the processing target substrate W, and to that extent, the concentration of implanted dopants is also decreased.

Figure 6:
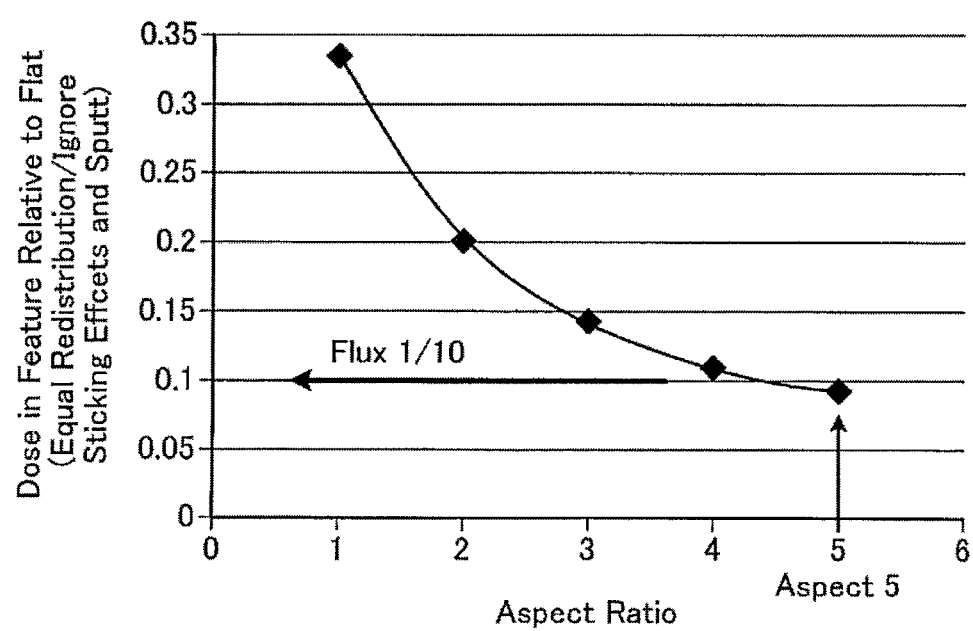
FIG. 6 is a graph illustrating a relationship between an aspect ratio of a FinFET in the FinFET-type semiconductor device, and a relative ratio of a concentration of implanted dopants.

FIG. 6 is a graph illustrating a relationship between an aspect ratio of a FinFET in the FinFET-type semiconductor device, and a relative ratio of a concentration of implanted dopants. In the example illustrated in FIG. 6, a case where, for example, reflection is not taken into consideration is illustrated. The concentration of the dopants illustrated in FIG. 6 is based on the case where As (arsenic) is implanted into a silicon substrate. As illustrated in FIG. 6, when the aspect ratio is "1", that is, a ratio of a length of the top portion to a length of the side surface is "1:1", in a case where the concentration of the dopants implanted into the top portion is "1", the concentration of the dopants implanted into the bottom portion becomes about "0.4." When the aspect ratio is "5", that is, a ratio of a length of the top portion to a length of the side surface is "1:5", in a case where the concentration of the dopants implanted into the top portion is "1", the concentration of the dopants implanted into the bottom portion becomes about "0.1." In this manner, it can be found that when doping is performed on the FinFET-type semiconductor device by using the plasma doping processing, it is difficult to perform conformal doping only by performing the plasma doping processing.

Here, as described above, in the first exemplary embodiment, after the dopants are implanted by the plasma doping processing, the annealing processing is performed. As a result, conformal doping becomes possible as compared to a case where only the plasma doping processing is used. That is, the dopants which are implanted in an excessive amount, as compared to the dopants implanted into the side surface or the bottom portion, are removed in a larger amount by the annealing processing. As a result, the conformal doping becomes possible.

As described above, in the first exemplary embodiment, ion implantation is performed using radicals and low energy ion components in the plasma doping processing rather than ion beam. This is because when the doping is performed using the ion beam, the effect obtained by the annealing processing is not significant.

Figure 7:
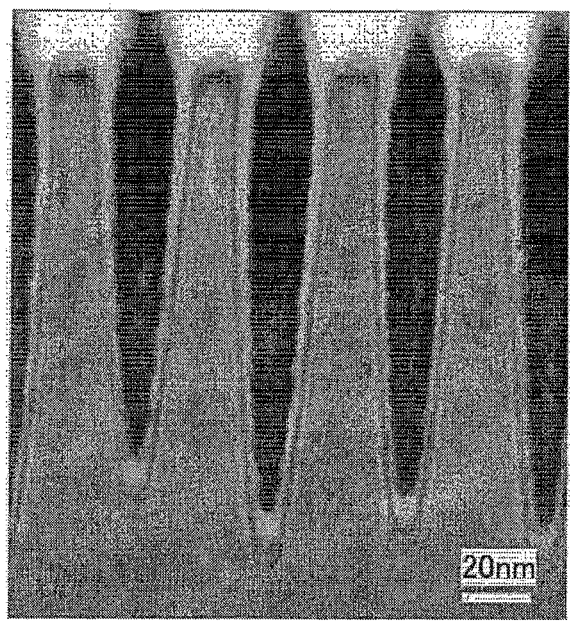
FIG. 7 is a view illustrating a cross-sectional image observed by a STEM when doping was performed using a conventional ion implanting device.
Figure 8:
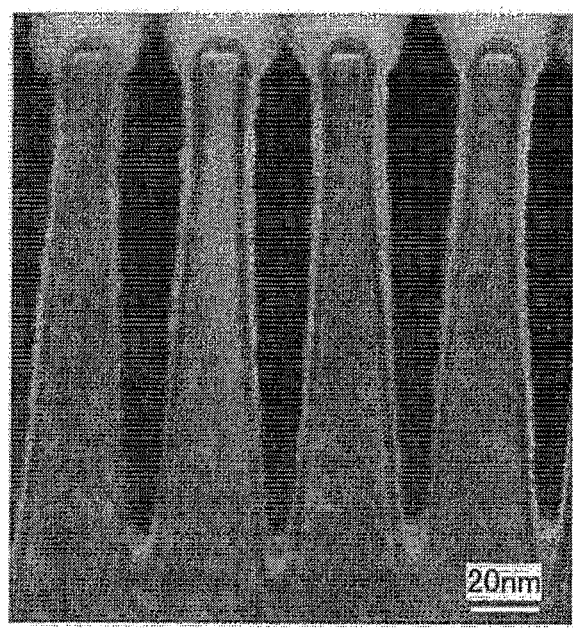
FIG. 8 is a view illustrating a cross-sectional image observed by a STEM when doping was performed mainly using radicals and low energy ion components (active species) of desired dopant generated by plasma in a plasma doping processing.

FIG. 7 is a view illustrating a cross-sectional image observed by a STEM when doping was performed using a conventional ion implanting device. FIG. 8 is a view illustrating a cross-sectional image observed by a STEM when doping was performed using radicals and low energy ion components in a plasma doping processing. The STEM image may more precisely illustrate the crystallinity of an observation object. When the top portion in the case where dopants were implanted using ion components in FIG. 7 is compared to the top portion in the case where dopants were implanted using radicals and low energy ion components in FIG. 8, a damage to the silicon crystals occurs at the top portion of a Fin in the case where the dopants were implanted using the ion components. That is, it may be thought that when the ion beam is used, irradiated ions are actively implanted into a region of the side portion near the top portion in the height direction of the Fin, and thus a large defect in silicon crystals occurs at the upper side of the side portion. As a result, it is thought that doped ions are implanted deeply into the Fin as compared to a case where the radicals and low energy ion components are used. Thus, it is thought that excessively implanted dopants are not taken off even when the annealing is performed, and conformal doping is not achieved.

As described above, the control unit 28 uses, as a microwave power for generating microwaves, a microwave power having a value which allows a power density per wafer unit density to be 4.2 W/cm$^2$ or more in the plasma doping processing. As a result, dopants may be appropriately implanted.

As described above, the control unit 28 performs the annealing processing at a temperature ranging from 600° C. to 950° C. when As is used as dopants. As a result, conformal doping may be possible.

Hereinafter, conditions for performing the annealing processing, such as a temperature, and a time, will be further described. A solid arsenic oxide compound (AsO) is sublimated at 460° C. or more under normal pressure, and a solid arsenic (As) is sublimated at 613° C. or more. Based on this, for example, annealing may be appropriately performed at 600° C. or more. Also, annealing may be performed at 950° C. or less without affecting dopants dispersed in Si. Based on a dopant profile in the processing target substrate W (mostly obtained from SIMS analysis), a change before and after the conformal annealing processing may be as small as possible. Thus, in a value obtained by multiplying an annealing temperature by a processing time (referred to as a thermal budget), the temperature may be as low as possible and the time is as short as possible.

As described above, the plasma generating mechanism includes the dielectric window 36 which is exposed within the processing container 32 and provided at a location facing the holding unit 34. Here, a shortest distance between the dielectric window 36 and the processing target substrate W held on the holding unit 34 is set to range from 5.5 cm to 15 cm. That is, when the distance between the dielectric window 36 and the processing target substrate W is less than 5.5 cm, microwave plasma may become unstable, and thus a benefit from plasma doping using microwaves, that is, a small damage caused by plasma irradiation, may not be achieved. When the distance between the dielectric window 36 and the processing target substrate W is greater than 15 cm, the Flax (amount) of radicals and low energy ion components reaching the processing target substrate W becomes unsufficient. Thus, the dopants are not sufficiently supplied to the processing target substrate W. Based on this, the doping may be properly performed by setting the shortest distance between the dielectric window 36 and the processing target substrate W held on the holding unit 34 to range from 5.5 cm to 15 cm.

As described above, in the plasma doping processing, the control unit 28 performs the plasma doping processing by using plasma which is generated through the radial line slot antenna by microwaves as a plasma source. As a result, a sufficient amount of dopants may be implanted. That is, as a method of generating radicals and low energy ion components, a method using inductively coupled plasma (ICP) may be considered. In contrast, as described above, when the radial line slot antenna is used, as compared to when other plasma sources are used, more plasma may be generated. Thus, a sufficient amount of dopants may be implanted.

Other Exemplary Embodiments

The exemplary embodiment of the present disclosure has been described with reference to drawings, but the present disclosure is not limited thereto. Various modifications and variations may be made for the described exemplary embodiment.

Annealing Processing

For example, in the above described exemplary embodiment, in the doping apparatus, the annealing processing is performed after the plasma doping processing, but the present disclosure is not limited thereto. For example, a separate heating device from the doping apparatus may be used to perform the annealing processing. In this case, in the doping apparatus, respective units used for the annealing processing may be omitted. In a more detailed example, the doping apparatus may not include the heater 34a.

Confirmation of Doping Result

For example, after the plasma doping processing is performed, before the annealing processing is performed, it may be determined whether sufficient dopants have been implanted by the plasma doping processing. That is, it is not limited to a case where the plasma doping processing and the annealing processing are continuously performed.

Figure 9:
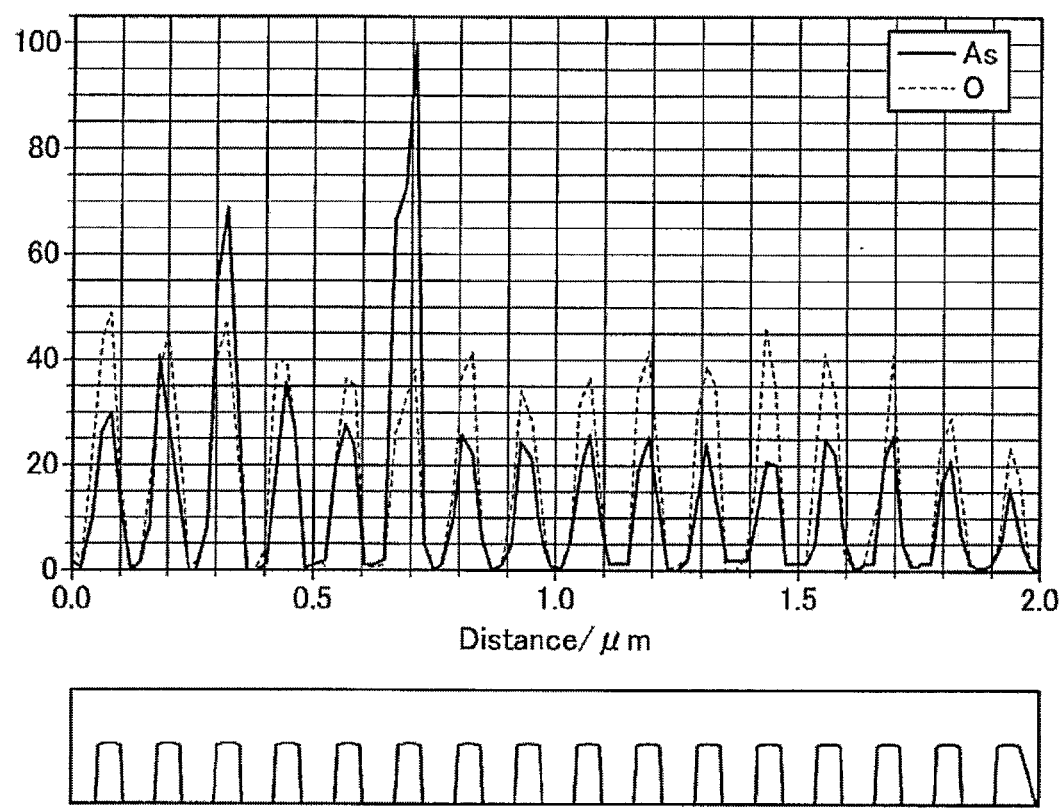
FIG. 9 is a view illustrating a result obtained by performing EDX line scanning on a processing target substrate W which was subjected to a conventional doping processing after the processing target substrate W was cut to expose a cross-section of the processing target substrate W.

FIG. 9 is a view illustrating a result obtained by performing energy dispersive X-ray spectroscopy (EDX) line scanning on a processing target substrate W which was subjected to a conventional plasma doping processing after the processing target substrate W was cut to expose a cross-section of the processing target substrate W. In FIG. 9, the horizontal axis indicates a position of the processing target substrate W, and the vertical axis indicates an amount of As. In FIG. 9, for reference, the shape of the processing target substrate W is also illustrated at the bottom in the horizontal axis, at a position where the EDX line scanning was performed. In the example illustrated in FIG. 9, the result indicates that the amount of As doped on third and sixth Fins from the left is larger than the amount on other Fins, by 40% or more.

As described above, as a probability theory, due to, for example, excessive doping, doping may not be successful, that is, abnormal formation of a doping layer may occur. In order to verify such a case, in the conventional processing, as illustrated in FIG. 9, EDX line scanning was performed on the processing target substrate W after the processing target substrate W was cut to expose the cross-section of the processing target substrate W. However, in this case, the processing target substrate W is destroyed.

Based on this, for example, a reflected electron image may be photographed at energy suitable to a film pressure of the doping layer, and it may be determined whether doping has been properly performed. Specifically, after an acceleration voltage is set to a low value, a reflected electron image of the processing target substrate W which has been subjected to the plasma doping processing is photographed using a scanning electron microscope (SEM). As the acceleration voltage, a value of 1 keV or less may be used.

In general, when a SEM image is photographed, an acceleration voltage ranging from 3 keV to 5 keV is used. Thus, an acceleration voltage lower than the general acceleration voltage is used. When a voltage ranging from 3 keV to 5 keV is used, electrons are transmitted at a distance of up to several nanometers, so that the electrons pass by an As accumulated portion in the processing target substrate W and reach a non-As accumulated portion present as Si. As a result, it is impossible to see a doping state of As. Based on this, an acceleration voltage is set so that the electrons are transmitted up to a distance of a dopant implantation depth, and then the reflected electron image is photographed.

Figure 10:
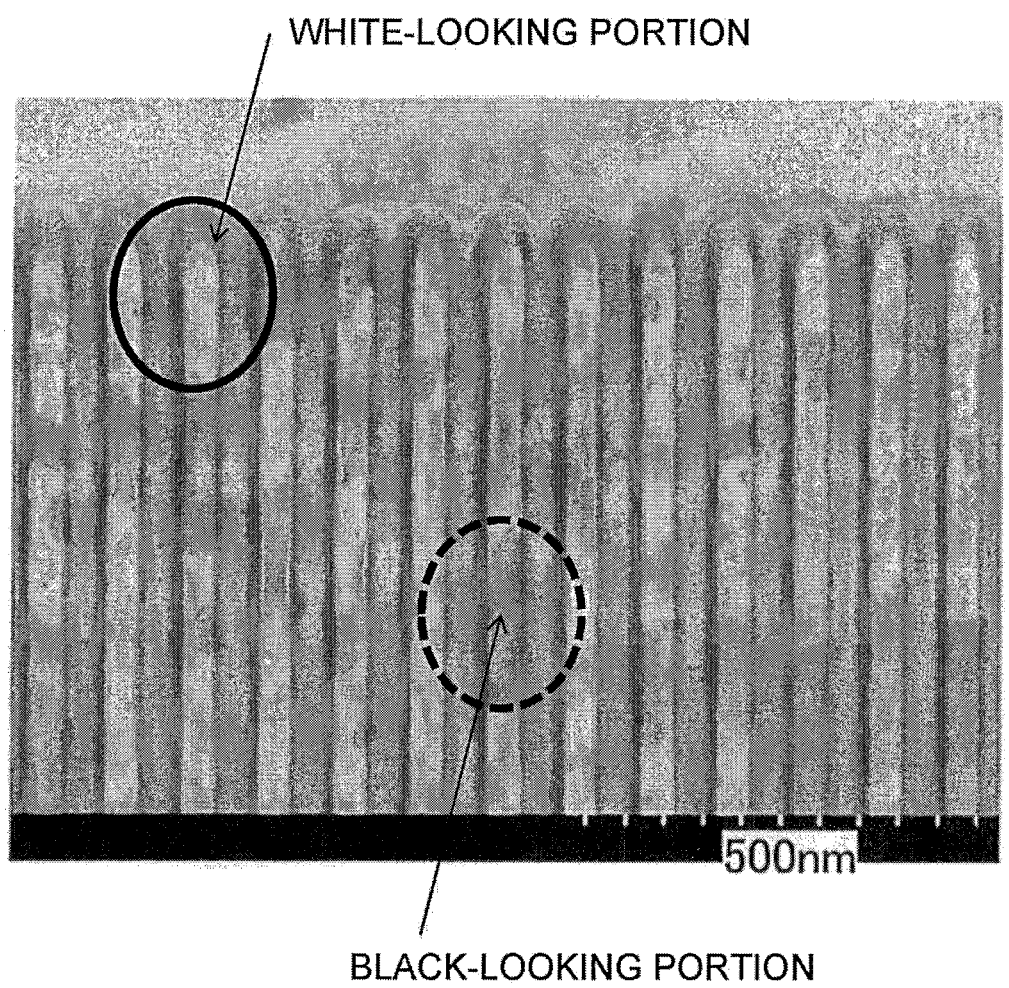
FIG. 10 is a view illustrating a reflected electron image of a processing target substrate W which was subjected to a plasma doping processing, which was photographed using an acceleration voltage of 1 keV.

Then, it is determined that dopants are excessively implanted into a portion which looks white. That is, in a reflected electron image, a portion where electrons do not rebound looks black. A portion looking white indicates that more electrons are reflected. Here, in the processing target substrate W, in the portion looking white, an insulating film is present and As is accumulated in a large amount as compared to in other portions, and as a result, electrons are rebound in a large amount as compared to in other portions. In FIG. 10, an example of the white-looking portion and an example of the black-looking portion are surrounded by circles.

Figure 11:
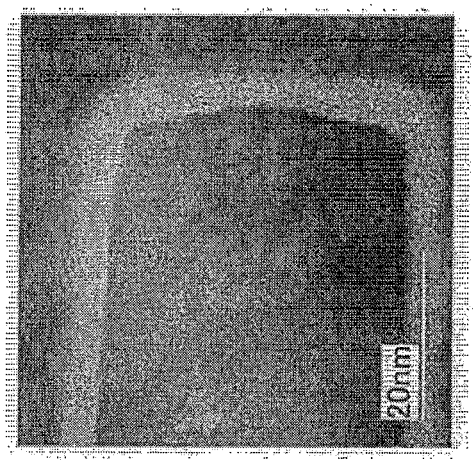
FIG. 11 is a view illustrating an SEM image on a black-looking region in the reflected electron image.
Figure 12:
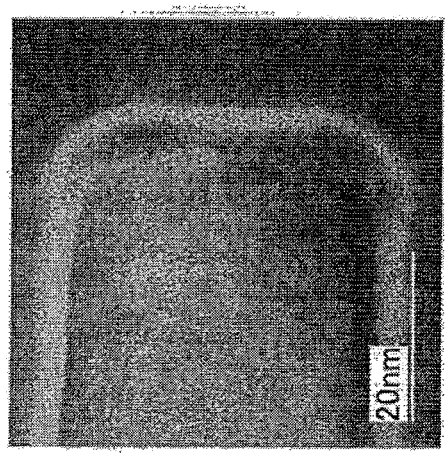
FIG. 12 is a view illustrating an SEM image on a white-looking region in the reflected electron image.

FIG. 10 is a view illustrating a reflected electron image on a processing target substrate W which was subjected to a plasma doping processing, which was photographed using an acceleration voltage of 1 keV. FIG. 11 is a view illustrating an SEM image on a black-looking region in the reflected electron image, and FIG. 12 is a view illustrating an SEM image on a white-looking region in the reflected electron image. As illustrated in FIG. 11, in the black-looking region in FIG. 10, a doping layer is conformally formed on the top portion of a Fin, while as illustrated in FIG. 12, in the white-looking region in FIG. 10, a doping layer is not conformally formed on the top portion of a Fin.

Example 1

In Example 1, doping was performed on a Si substrate by a plasma doping processing using following conditions. Then, the substrate was carried out of the doping apparatus, and subjected to an annealing processing by a lamp annealing device at 850° C. for 30 sec. At a point of time when the plasma processing was completed and at a point of time when the annealing processing was completed, SEM-EDX image was photographed using the following conditions, and As concentration was calculated based on the photographed image.

Conditions of Plasma Doping Processing
Microwave power: 5 kW
Pressure within processing container: 230 mTorr
Input power for applying RF bias (13.56 MHz) to wafer stage: 300 W
Total flow rate of processing gas: 1000 sccm ($AsH_3$ (0.7%)/He dilution gas flow rate: 343 sccm, He gas: 657 sccm)
Plasma doping processing: 100 sec
Conditions of Annealing Processing
Temperature: 850° C.
Time: 30 sec
Conditions of SEM-EDX Photography
A SEM observation sample was processed into thin chips using a FIB apparatus, and was analyzed and evaluated using a SEM (electron microscope).

Comparative Example 1

In Comparative Example 1, ion doping was performed on a Si substrate by using an ion implanting device under the following conditions (ion implantation amount ($As^+$) 2E15 atoms/$cm^2$, implantation angle 45°, two-step implantation (0° and wafer half rotation (180°)). Then, an annealing processing was performed by using a general lamp annealer at 850° C. for 30 sec. Like in Example 1, at a point of time when the plasma doping processing was completed and at a point of time when the annealing processing was completed, SEM-EDX image was photographed using the following conditions, and As concentration was calculated based on the photographed image.

Results of Example 1 and Comparative Example 1

Figure 13:
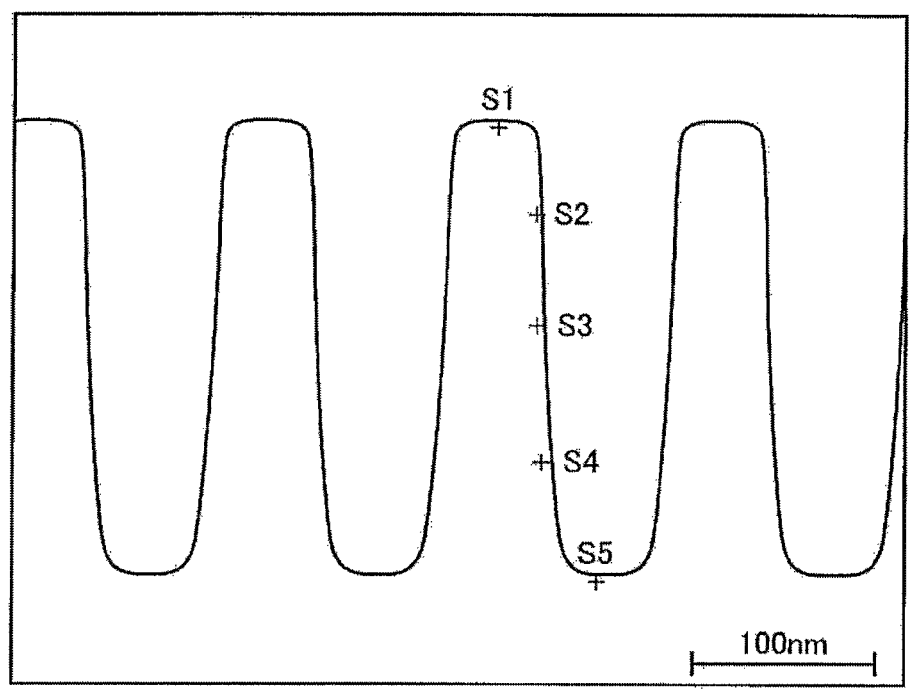
FIG. 13 is a view illustrating an example of a cross-section of a Si substrate used in Example 1 and Comparative Example 1.

FIG. 13 is a view illustrating an example of a cross-section of a Si substrate used in Example 1 and Comparative Example 1. Hereinafter, unless otherwise noted, "S1" to "S5" indicate positions at a Fin illustrated in FIG. 13. S1 indicates a top portion of the Fin, S2 to S4 indicate a side surface of the Fin, and S5 indicates a bottom portion.

Figure 14:
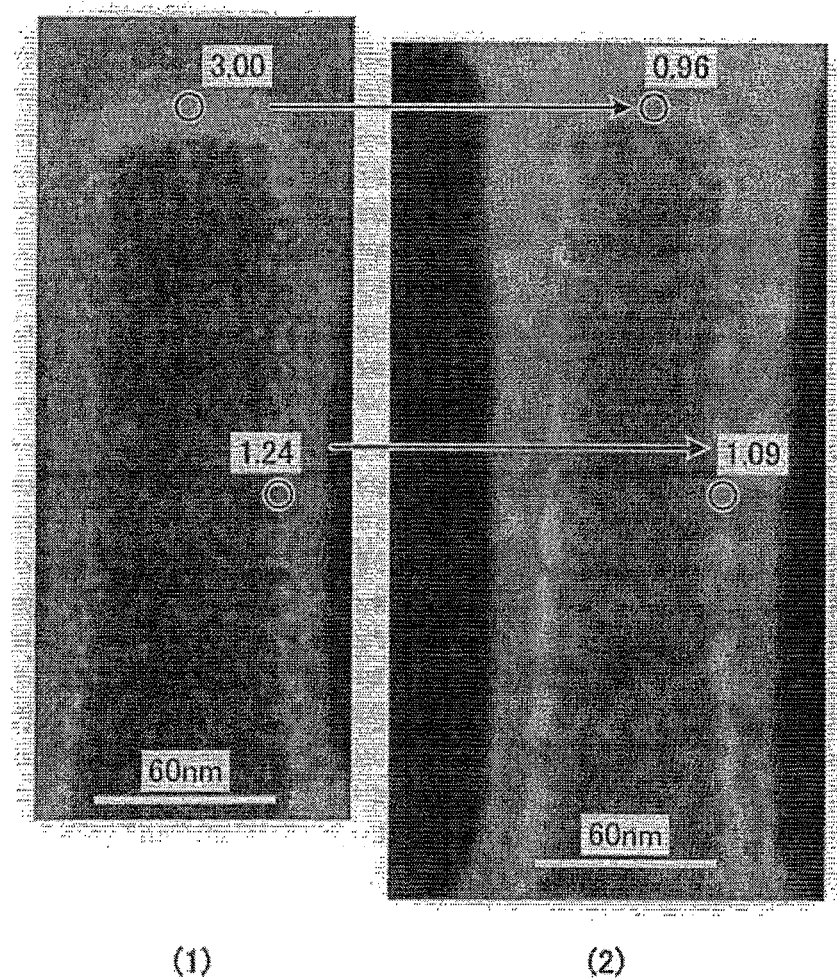
FIG. 14 illustrates SEM-EDX images photographed in Example 1. (1) of FIG. 14 indicates a SEM-EDX image after the plasma doping processing, and (2) of FIG. 14 indicates a SEM-EDX image after the annealing processing.

FIG. 14 is a view illustrating SEM-EDX images photographed in Example 1. (1) of FIG. 14 indicates a SEM-EDX image after the plasma doping processing, and (2) of FIG. 14 indicates a SEM-EDX image after the annealing processing. Here, as illustrated in FIG. 14, after the plasma doping processing before the annealing processing, As concentrations at S1 and S2 were "3%" and "1.24%", after the annealing processing, the As concentrations became "0.96%" and "1.09%", respectively.

Figure 15:
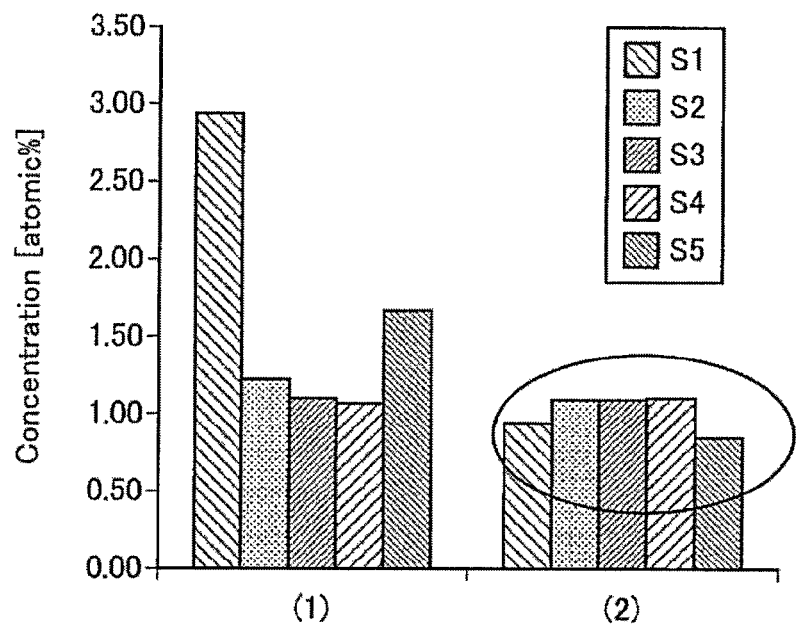
FIG. 15 is a graph illustrating As concentrations at S1 to S5 in Example 1 before and after the annealing processing.

FIG. 15 is a graph illustrating As concentrations at S1 to S5 in Example 1 before and after the annealing processing. As illustrated in FIG. 15, after the annealing processing, as compared to before the annealing processing, a variation among As concentrations at the top portion, the side surface, the bottom portion of the Fin was decreased and conformal doping was achieved.

Figure 16:
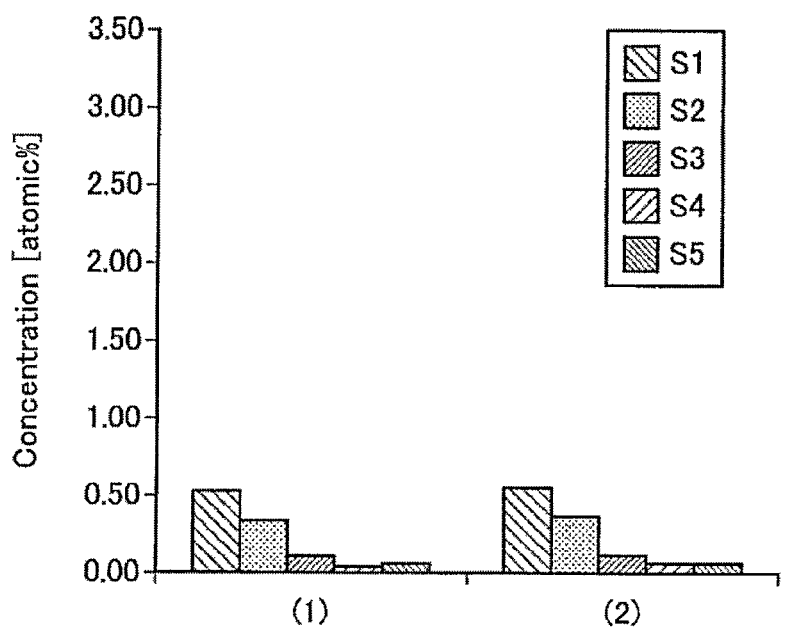
FIG. 16 is a graph illustrating As concentrations at S1 to S5 in Comparative Example 1 before and after the annealing processing.

FIG. 16 is a graph illustrating As concentrations at S1 to S5 in Comparative Example 1 before and after the annealing processing. As illustrated in FIG. 16, the use of the ion doping is different from the method of implanting dopants using the plasma doping processing. As concentrations before and after annealing are hardly changed.

Examples 2 to 16

In each of Examples 2 to 16, an annealing processing was performed using the following conditions. Other processings were the same as those in Example 1.

Example 2

Annealing temperature: 650° C.
Annealing time: 30 sec

Example 3

Annealing temperature: 650° C.
Annealing time: 60 sec

Example 4

Annealing temperature: 650° C.
Annealing time: 180 sec

Example 5

Annealing temperature: 750° C.
Annealing time: 30 sec

Example 6

Annealing temperature: 750° C.
Annealing time: 60 sec

Example 7

Annealing temperature: 750° C.
Annealing time: 180 sec

Example 8

Annealing temperature: 850° C.
Annealing time: 30 sec

Example 9

Annealing temperature: 850° C.
Annealing time: 60 sec

Example 10

Annealing temperature: 850° C.
Annealing time: 180 sec

Example 11

Annealing temperature: 950° C.
Annealing time: 30 sec

Example 12

Annealing temperature: 950° C.
Annealing time: 60 sec

Example 13

Annealing temperature: 950° C.
Annealing time: 180 sec

Example 14

Annealing temperature: 1050° C.
Annealing time: 30 sec

Example 15

Annealing temperature: 1050° C.
Annealing time: 60 sec

Example 16

Annealing temperature: 1050° C.
Annealing time: 180 sec

Comparative Example 2

In Comparative Example 2, a plasma doping processing was performed under the same conditions as those in Example 1, but an annealing processing was not performed. Other conditions are the same as those in Example 1.

Results of Examples 2 to 16 and Comparative Example 2

Figure 17:
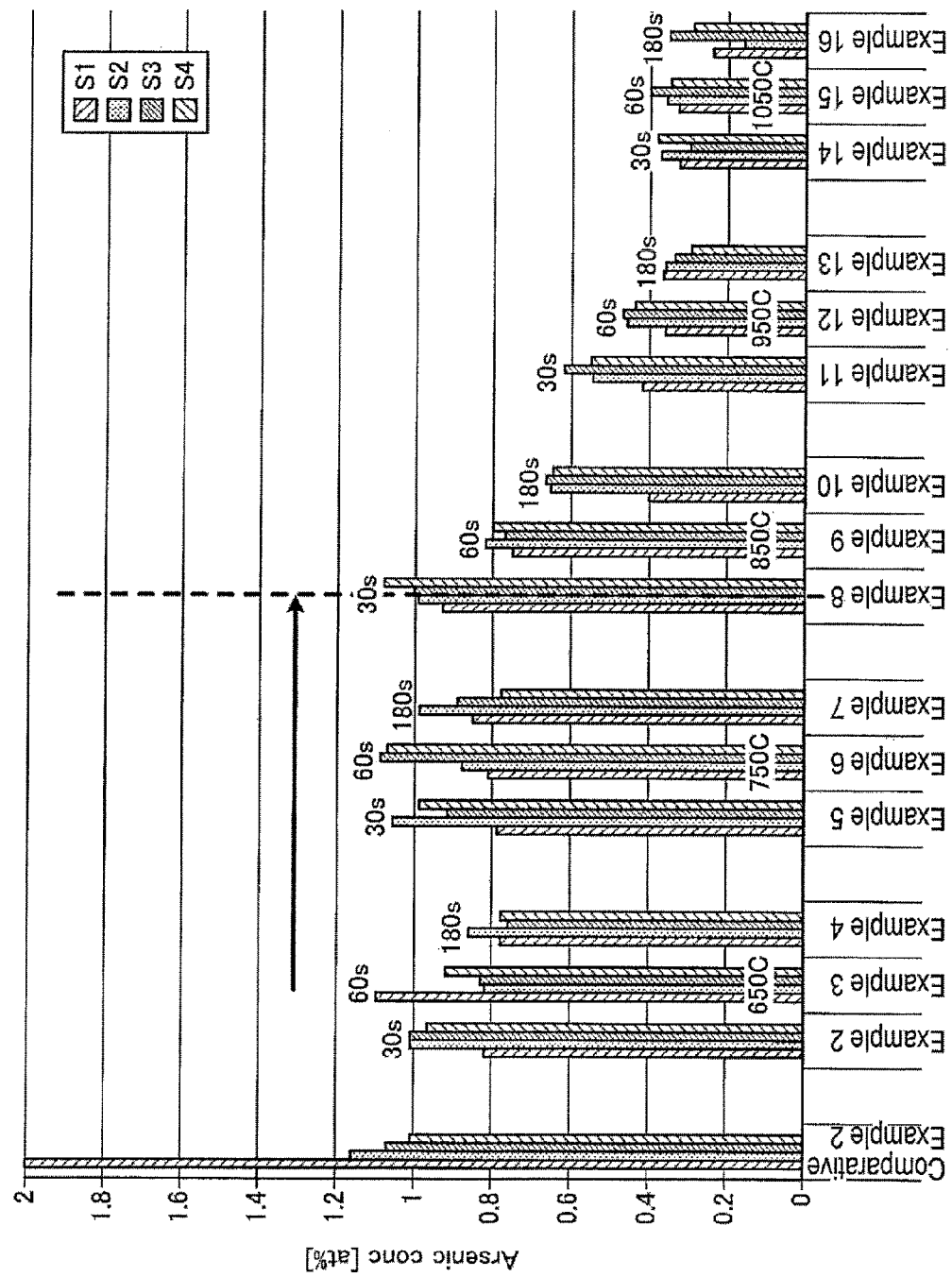
FIG. 17 is a graph illustrating results of Examples 2 to 16 and Comparative Example 2.

FIG. 17 is a graph illustrating the results of Examples 2 to 16 and Comparative Example 2. As illustrated in FIG. 17, when an annealing temperature was 850° C. or more and a processing time was 60 sec or more (Examples 9 to 16), a dopant concentration was reduced at a side surface as well as a top portion of a Fin. It is thought that such a reduction was caused by a change in a doping profile immediately after doping because a thermal history in the annealing processing was excessive. At an annealing temperature of lower than 950° C., a dopant concentration at a top portion of a Fin was selectively reduced although depending on an annealing time, so that conformal doping was achieved. At an annealing temperature of 850° C., when the annealing was performed for a time of less than 60 sec, a dopant concentration at a top portion of a Fin was selectively reduced. Also, conformal doping was achieved without causing a change in the doping profile immediately after doping.

Comparative Example 3

Figure 18:
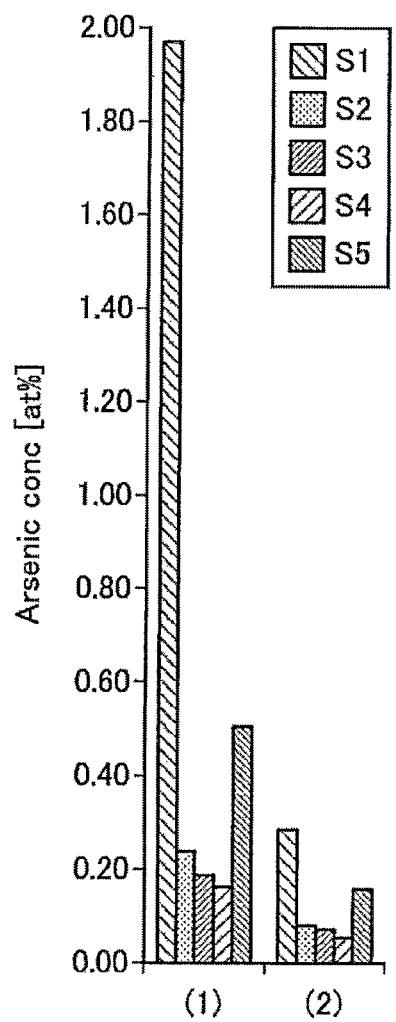
FIG. 18 is a graph illustrating results of Comparative Example 3.

In Comparative Example 3, after plasma doping was performed mainly using ion components in plasma as described below, and an annealing processing was performed as described below. Other conditions were the same as those in Example 1.
 Conditions of Plasma Doping Processing Using Ions
 Microwave power: 3 kW
 Pressure within processing container: 150 mTorr
 Input power for applying RF bias (13.56 MHz) to wafer stage: 750 W
 Total flow rate of processing gas: 1000 sccm ($AsH_3$ (0.7%)/He dilution gas flow rate: 98 sccm, He gas: 900 sccm)
 Plasma doping processing: 40 sec
 Conditions of Annealing Processing
 Temperature: 850° C.
 Time: 30 sec FIG. 18 is a graph illustrating the results of Comparative Example 3. Graph (1) in FIG. 18 indicates a state after the plasma doping before the annealing processing, and Graph (2) in FIG. 18 indicates a state after the annealing processing. As illustrated in FIG. 18, unlike in Examples described above, when the plasma doping using ions was performed, conformal doping was not achieved even by performing the annealing processing. That is, even when the above described annealing processing, that is, a conformal annealing processing, is applied to a conventionally used plasma doping using ions, or an impurity injection technology using an ion implanting technology, conformal doping may not be formed on the processing target substrate. In contrast, as described above, the plasma doping using radicals and low energy ion components, and the above described annealing processing may be performed in combination so that conformal doping is achieved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of performing a doping on a processing target substrate by implanting dopant ions into the processing target substrate, the method comprising:
   providing a processing container equipped with a dielectric window configured to introduce a microwave generated from a microwave generator and a holding unit configured to hold the processing target substrate;
   generating plasma within the processing container using the microwave and a doping gas thereby performing a plasma doping processing on the processing target substrate held on the holding unit within the processing container; and
   after the performing of the plasma doping processing, segregating a concentration of the dopant ions on a surface of the processing target substrate by annealing the processing target substrate which has been subjected to the plasma doping processing such that the dopant ions are conformally reformed throughout the entire surface of the processing target substrate.

2. The method of claim 1, wherein the plasma doping processing uses, as a microwave power for generating the microwave, a microwave power having a value which allows a power density per wafer unit density to be 4.2 W/cm$^2$ or more.

3. The method of claim 1, wherein the annealing is performed at a temperature ranging from 600° C. to 950° C. when arsenic (As) is used as the dopant ions.

4. The method of claim 1, wherein the plasma doping processing is performed using the plasma generated by a radial line slot antenna.

5. The method of performing a doping on a processing target substrate of claim 1, the processing target substrate has a three-dimensional structure.

6. The method of claim 1, wherein the annealing is performed at a temperature ranging from 600° C. to 950° C. for a period of time ranging from 30 seconds to 90 seconds.

7. The method of claim 1, wherein when the annealing is performed at a temperature of 800° C. or less, the annealing is performed at a period of time ranging from 30 seconds to 90 seconds.

8. The method of claim 1, wherein when the annealing is performed at a temperature greater than 800° C., the annealing is performed at a period of time ranging 60 seconds or less.

9. A doping apparatus comprising:
   a processing container equipped with a dielectric window configured to introduce a microwave generated from a microwave generator and a holding unit configured to hold the processing target substrate;
   a gas supply unit configured to supply a doping gas and an inert gas for plasma excitation into the processing container;
   a heating mechanism configured to heat the processing target substrate; and
   a control unit configured to control the plasma generating mechanism to generate the plasma within the processing container using the doping gas and the inert gas supplied from the gas supply unit to perform a plasma doping processing on the processing target substrate held on the holding unit disposed within the processing container, and, after performing the plasma doping processing, to segregate a concentration of dopant ions on a surface of the processing target substrate by an annealing processing using the heating mechanism on the processing target substrate which has been subjected to the plasma doping processing such that the dopant ions are conformally reformed throughout the entire surface of the processing target substrate.

10. The doping apparatus of claim 9, wherein the control unit uses, as a microwave power for generating the microwave, a microwave power having a value which allows a power density per wafer unit density to be 4.2 W/cm$^2$ or more.

11. The doping apparatus of claim 9, wherein the control unit performs the annealing processing at a temperature ranging from 600° C. to 950° C.

12. The doping apparatus of claim 9, wherein the microwave generator includes a radial line slot antenna, and
   the control unit performs the plasma doping processing using the plasma generated by the radial line slot antenna.

13. The doping apparatus of claim 9, wherein the dielectric window of the microwave generator is exposed within the processing container and provided at a location facing the holding unit, and
   a shortest distance between the dielectric window and the processing target substrate held on the holding unit ranges from 5.5 cm to 15 cm.

14. A method of manufacturing a semiconductor device by a doping method, the doping method being designed for performing a doping on a processing target substrate by implanting dopant ions into the processing target substrate, the doping method comprising:
   providing a processing container equipped with a dielectric window configured to introduce a microwave generated from a microwave generator and a holding unit configured to hold the processing target substrate;
   generating plasma within the processing container using the microwave and a doping gas thereby performing a plasma doping processing on the processing target substrate held on the holding unit within the processing container; and
   after the performing of the plasma doping processing, segregating a concentration of the dopant ions on a surface of the processing target substrate by annealing the processing target substrate which has been subjected to the plasma doping processing such that the dopant ions are conformally reformed throughout the entire surface of the processing target substrate.

* * * * *